United States Patent [19]
Shimoji et al.

[11] Patent Number: 5,331,190
[45] Date of Patent: Jul. 19, 1994

[54] SEMICONDUCTOR DEVICE INCLUDING NONVOLATILE MEMORIES

[75] Inventors: Noriyuki Shimoji, Kyoto; Hironobu Nakao, Ukyo, both of Japan

[73] Assignee: Rohm Co., Ltd., Kyoto, Japan

[21] Appl. No.: 992,915

[22] Filed: Dec. 18, 1992

[30] Foreign Application Priority Data

Dec. 19, 1991 [JP] Japan ............................ 3-335416
Jan. 17, 1992 [JP] Japan ............................ 4-6827

[51] Int. Cl.$^5$ .................... H01L 29/68; H01L 29/78; G11C 11/34
[52] U.S. Cl. ........................ 257/324; 257/325; 257/326; 257/365; 365/182; 365/184
[58] Field of Search ............ 257/324, 325, 326, 365; 365/182, 184

[56] References Cited

U.S. PATENT DOCUMENTS 4,330,850  5/1982  Jacobs et al. .................... 257/324

Primary Examiner—Mark V. Prenty
Attorney, Agent, or Firm—Peter J. Gluck; Thomas R. Morrison

[57] ABSTRACT

The present invention provides nonvolatile semiconductor memory which has advantages permitting the cell of the memory circuit to integrate, the memory circuit to be easy to manufacture, and the manufacturing expense to be cut down. The nonvolatile memory (21) comprises a P type well for which a N+ type source (4) and a N+ type drain (3) is provided. A surface of a space between the source (4) and the drain (3) comprises a first portion (10a) and a second portion (10b). An insulating layer (6) for holding electrons spans the surface of the space. A memory gate electrode (5) is on the insulating layer (6) and spans the first portion (10a). The surface of the second portion (10b) and a part of the surface of the memory gate electrode (5) is covered with a first region electrode (24) attaching to the source (4). But the first region electrode (24) is insulated from the memory gate electrode (5) with the insulating layer (8).

20 Claims, 12 Drawing Sheets

| mode | selected memory | X1 | X2 | W1 | W2 | B1 | B2 | PW |
|---|---|---|---|---|---|---|---|---|
| writing | C11 | −4 | −4 | 5 | −4 | −4 | 5 | −4 |
| erasing | C11, 12 | −4 | −4 | −4 | 5 | 5 | 5 | 5 |
| reading | C11 | 5 | 0 | 0 | 0 | SA | OPEN | 0 |

|  | BL1 | BL2 | WL1 | WL2 | S1 | PW |
|---|---|---|---|---|---|---|
| writing | 0 | 7 | 10 | 0 | 0 | 0 |
| erasing | OPEN | OPEN | 0 | 10 | OPEN | 10 |
| reading | 0 | OPEN | 3 | 0 | 2 | 0 |

SEMICONDUCTOR DEVICE INCLUDING NONVOLATILE MEMORIES

BACKGROUND OF THE INVENTION

1. Field of the Invention

The present invention relates to a semiconductor nonvolatile memory and, more particularly, improvement in integration, speed of operation and productivity thereof.

2. Description of the Prior Art

In related art, there is an instance of semiconductor nonvolatile memory 1 as shown in FIG. 1. Referring to FIG. 1, a P type well 2 includes a drain 3 and a source 4, the two region forming a space comprising a region 10a and a region 10b. Between the region 10a and a memory gate electrode 5 is an insulating layer 6 for holding electrons. This insulating layer 6 has a structure of three layer: a silicon dioxide layer 6a, a silicon nitride layer 6b, and a silicon dioxide layer 6c. The silicon nitride layer 6b is where electrons can be trapped by bias between the well 2 and the memory gate electrode 5. The insulating layer 6 and a silicon dioxide layer 8 insulate a control gate electrode 7 from both the memory gate electrode 5 and the region 10b.

It is arranged that the region 10b changes from nonconductive into conductive when a stable positive voltage is applied to the control gate electrode 7 and that the region 10a changes from conductive into nonconductive when a stable positive voltage is applied to the gate electrode 5.

The operations of writing data into and reading data from the nonvolatile memory 1 will be described. To write data into the memory 1, a positive voltage such as 9 V is applied to the memory gate electrode 5 relative to the drain 3 and the source 4, whereby electrons in the P type well 2 move into the insulating layer 6 and get trapped therein. This change in charge distribution due to the trapped electrons cause the region 10a to change from conductive into nonconductive. These electrons remain trapped in the insulating layer 6 even when the voltage applied to the memory gate electrode 5 is cut off. This state wherein electrons are trapped in the insulating layer 6 is referred to as "write state" hereinafter.

In the reading operation, a positive voltage, which is larger than the threshold voltage for the conductive channel of the region 10b, is applied to the control gate electrode 7 relative to the drain 3 and the source 4, whereby the region 10b changes from nonconductive into conductive.

Therefore, when the insulating layer 6 has electrons trapped therein and a voltage is applied to the drain 3 relative to the source 4 a current flows between the drain 3 and the source 4. It is because the regions 10a and 10b are conductive. Conversely, when the insulating layer 6 have no electron trapped therein and a voltage is applied to the drain 3 relative to the source 4, no current flows between the drain 3 and the source 4. This is because the region 10a is nonconductive.

As is described above, it can be determined whether or not the memory 1 is in "write state", by determining whether or not a current flows between the drain 3 and the source 4.

To erase data from the nonvolatile memory, a positive voltage is applied to the P type well 2 relative to the memory gate electrode 5. This application of the voltage causes the electrons trapped in the insulating layer 6 to return the well 2. This indicates that the data of the memory has been erased.

A memory circuit can be constructed by using the above-mentioned memories 1 which array in rows and columns. The memory circuit is shown in partial view of equivalent circuit 15 in FIG. 2A. As shown in FIG. 2A, each word line W connects with all control gate electrodes of memories arrayed in a row and each word line X connects with all memory gate electrodes of memories arrayed in a row and each bit line connects with all drains of memories arrayed in a column and a well line PW connects with sources of all of the memories arrayed in rows and columns as well as wells for each of them.

So as not to write data into and read data from memories other than a desired memory, the following means can select a desired memory from the memory circuit.

FIG. 2B is a table showing an example of combinations of voltages applied to each of the individual lines at writing, erasing and reading operations, the combination enabling the memory circuit to select a desired memory, for example, a memory C11 at writing and reading operations.

More specifically, to write data into the selected memory C11, a voltage of 5 V is applied to both the word line W1 and the bit line B2 and a voltage of −4 V is applied to each of the other individual lines. That means that a positive voltage of 9 V (volts) is applied to the memory gate electrode 5 of the selected memory C11 relative to the well 2, the source 4 and the drain 3. As a result of the application, the insulating layer 6 of the selected memory C11 traps electrons therein.

Referring to the nonselected memory C12, the voltage of 5 V is applied to the memory gate electrode 5 and thereby the region 10a changes into conductive. The voltage of 5 V applied to the drain 3 can travel into the region 10a. That is, there is no potential difference between the memory gate electrode 5 and the well 2. Therefore, the insulating layer 6 of the nonselected memory C12 traps no electrons therein. Referring to the other nonselected memories C13 and C14, the voltage of −4 V is applied to the memory gate electrode 5. Therefore, the insulating layer 6 traps no electrons therein, respectively.

Note that the voltage of −4 V is applied to the word lines X1 and X2 in order that all the regions 10b of memories C11, C12, C13 and C14 get nonconductive. Therefore, the voltage of 5 V applied to the bit line B2 can travel into the region 10a of the memory C12 without a loss.

Reading operation is effected by applying a voltage of 5 V to a word line X1, applying a positive voltage to the bit line B1 connected to a sense amplifier, leaving the bit line B2 floating and applying a voltage of 0 V to each of the other individual lines.

Referring to the selected memory C11, the region 10b is conductive because the voltage of 5 V is applied to the control gate electrode 7. When the memory C11 has electrons trapped in the insulating layer 6 the region 10a is nonconductive. Therefore, no current flows through the bit line B1. Conversely, when the memory C11 has no electrons trapped in the insulating layer 6 the region 10a is conductive. Therefore, a current flows through the bit line B1.

Referring to the nonselected memory C12, the region 10b is conductive because the voltage of 5 V is applied to the control gate electrode 7. However, since the source 4 is in a voltage of 0 V applied and the bit line B2 is left floating, no current flows through the a bit line B2 even when the region 10a is conductive. Referring to the other nonselected memories C13 and C14, the region 10b is nonconductive respectively because the word line X2 is at a voltage of 0 V applied. Therefore, no current flows through the bit line B1 and through the bit line B2 respectively.

As is described above, in the memory circuit, data can be written into and read from a desired memory.

Meanwhile, erasing operation is effected by applying a voltage of −4 V to all of the word line X1, the word line X2 and the word line W1, and applying a voltage of 5 V to the other individual lines.

Referring to the selected memory C11 and C12, since the well line PW has a voltage of 5 V and the memory gate electrode 5 has a voltage of −4 V, the electric field developed between the well 2 and the memory gate electrode 5 causes electrons in the insulating layer 6 move into the well 2. This indicates that the data of the memories C11 and C12 has been erased.

Referring to the nonselected memories C13 and C14, since the well 2 has a voltage of 5 V and the memory gate electrode 5 has a voltage of 5 V, no electric field develops between the well 2 and the memory gate electrode 5. Therefore, the data of the memories C13 and C14 is left unchanged.

The above-mentioned memory circuit, however, has a flowing problem.

Each of the memories in the memory circuit comprises two field effect transistors with a common source and a common drain.

These two field effect transistors bar the memory cell and the memory circuit from integrating and being manufactured easily.

Meanwhile, in order to control the conductivity of the region 10b by application of electric field between the well 2 and the control gate electrode 7, it is necessary to arrange a certain width of the region 10b correctly during the manufacturing process. This width W is determined by a width of a photoresist pattern using as a mask. In lithography technique, it is difficult to locate the photoresist pattern mask at a predetermined position in the substrate. Therefore, it is difficult to form the region 10b with a predetermined width.

SUMMARY OF THE INVENTION

Accordingly, it is an object of the present invention to provide nonvolatile semiconductor memory that comprises one-transistor cells and that has advantages in integrating the cell and in cutting down the manufacturing expense.

A semiconductor device including nonvolatile memories according to one embodiment of the present invention comprises:

a) a substrate of semiconductor,
b) a first region formed in the surface of the substrate,
c) a second region formed in the surface of the substrate and defining a space between the first region and the second region, the surface of the space comprising a first portion and a second portion,
d) an insulating layer for holding electrons spanning the first portion and the second portion,
e) a control electrode being on the insulating layer and spanning the first portion, and
f) a first region electrode attaching to the first region, spanning the second portion and being electrically disconnected from the control electrode.

A semiconductor device including nonvolatile memories according to another embodiment of the present invention comprises:

a) a substrate of semiconductor,
b) a first region formed in the surface of the substrate,
c) a second region formed in the surface of the substrate and defining a space between the first region and the second region, the surface of the space comprising a first portion and a second portion,
d) an insulating layer for holding electrons spanning the first portion and the second portion,
e) a control electrode being on the insulating layer and spanning the first portion, and
f) a conductive body which spans the second portion and is electrically disconnected from the control electrode.

A semiconductor device including nonvolatile memories according to further another embodiment of the present invention comprises:

a) a substrate of semiconductor,
b) a first region formed in the surface of the substrate,
c) a second region formed in the surface of the substrate and defining a space between the first region and the second region, the surface of the space comprising a first portion and a second portion,
d) an insulating layer for holding electrons spanning the first portion,
e) an insulating layer on the substrate and spanning the second portion,
f) a control electrode being on the insulating layer for holding electrons and spanning the first portion, and
g) a first region electrode attaching to the first region, spanning the second portion and being electrically disconnected from the control electrode.

A method for manufacturing a semiconductor device including nonvolatile memories according to one embodiment of the present invention comprises the steps of:

a) preparing a substrate of semiconductor,
b) depositing an insulating layer for holding electrons on all the surface of the substrate,
c) covering a part of the surface of the insulating layer with a control electrode wherein a portion of the surface of the substrate being spanned by the control electrode is defined as a first portion,
d) covering a part of the surface of the insulating layer adjacent to the control electrode with a resist pattern wherein a portion of the surface of the substrate being spanned by the resist pattern is defined as a second portion,
e) implanting a dopant into the substrate using the resist pattern as a mask so that a first region and a second region are created in the substrate, and
f) attaching a first region electrode to the first region, the first region electrode being on the insulating layer, spanning the first portion and being insulated from the control electrode.

A method for manufacturing the semiconductor device including nonvolatile memories according to another embodiment of the present invention comprises steps of:

a) preparing a substrate of semiconductor,
b) depositing an insulating layer for holding electrons on all the surface of the substrate,
c) covering a part of the surface of the insulating layer with a control electrode wherein a portion of the surface of the substrate being spanned by the control electrode is defined as a first portion, d) covering a part of the surface of the insulating layer adjacent to the control electrode with a conductive body wherein the conductive body is insulated from the control electrode and a portion of the surface of the substrate being spanned by the conductive body is defined as a second portion, e) implanting a dopant into the substrate using both the conductive body and the control electrode as a mask so that a first region and a second region are created in the substrate, f) attaching a first region electrode to both the first region and the conductive body.

A method for manufacturing the semiconductor device including nonvolatile memories according to further another embodiment of the present invention comprises steps of:

a) preparing a substrate of semiconductor, b) depositing an insulating layer for holding electrons on all the surface of the substrate, c) covering a part of the surface of the insulating layer for holding electrons with a control electrode wherein a portion of the surface of the substrate spanned by the control electrode is defined as a first portion, d) removing the unwanted insulating layer for holding electrons and subjecting the surface of the substrate to oxidataion, e) covering a part of the surface of the insulating layer adjacent to the control electrode with a resist pattern wherein a portion of the surface of the substrate spanned by the resist pattern is defined as a second portion, f) implanting a dopant into the substrate using the resist pattern as a mask so that a first region and a second region are created in the substrate, and g) attaching a first region electrode to the first region, the first region electrode being on the insulating layer, spanning the first portion and being insulated from the control electrode.

A method for operating memories, which comprise a substrate of semiconductor, a source formed in the surface of the substrate, a drain formed in the surface of the substrate and defining a space between the source and the drain, the surface of the space comprising a first portion and a second portion, an insulating layer for holding electrons spanning the first portion and the second portion, a memory gate electrode being on the insulating layer and spanning the first portion, and a first region electrode attaching to the source, spanning the second portion and being insulated from the memory gate electrode, according to one embodiment of the present invention comprises steps of:

a) arraying the memories in rows and columns, b) connecting each of drain lines to all the drains of the memories arrayed in a row, c) connecting each of gate lines to all the memory gate electrodes of the memories arrayed in a column, d) connecting a source line to the sources of all the memories arrayed in lows and columns, e) to write data into a desired memory, applying a programming voltage to the gate line connecting with the desired memory and applying a voltage to the drains of the undesired memories in order not to write data into the undesired memories, and f) to read data from a desired memory, determining whether or not a current flows through a drain line connecting to the drain of the desired memory when a sense voltage is applied to a gate line connecting with the memory gate electrode of the desired memory as well as applying a reading voltage to the source line.

A method for operating memories, which comprises a substrate of semiconductor, a source formed in the surface of the substrate, a drain formed in the surface of the substrate and defining a space between the source and the drain, the surface of the space comprising a first portion and a second portion, an insulating layer for holding electrons spanning the first portion and the second portion, a memory gate electrode being on the insulating layer and spanning the first portion, an conductive body which spans the second portion and is insulated from the memory gate electrode, and a first region electrode attaching to the source and connecting with the conductive body, according to another embodiment of the present invention comprises steps of:

a) arraying the memories in rows and columns, b) connecting each of drain lines to all the drains of the memories arrayed in a row, c) connecting each of gate lines to all the memory gate electrodes of the memories arrayed in a column, d) connecting a source line to the sources of all the memories arrayed in lows and columns, e) to write data into a desired memory, applying a programming voltage to the gate line connecting with the desired memory and applying a voltage to the drains of the undesired memories in order not to write data into the undesired memories, and f) to read data from a desired memory, determining whether or not a current flows through a drain line connecting to the drain of the desired memory when a sense voltage is applied to a gate line connecting with the memory gate electrode of the desired memory as well as applying a reading voltage to the source line.

A method for operating memories, which comprises a substrate of semiconductor, a source formed in the surface of the substrate, a drain formed in the surface of the substrate and defining a space between the source and the drain, the surface of the space comprising a first portion and a second portion, an insulating layer for holding electrons spanning the first portion, and a first region electrode attaching to the source, spanning the second portion and being insulated from the memory gate electrode, according to further another embodiment of the present invention comprises steps of:

a) arraying the memories in rows and columns, b) connecting each of drain lines to all the drains of the memories arrayed in a row, c) connecting each of gate lines to all the memory gate electrodes of the memories arrayed in a column, d) connecting a source line to the sources of all the memories arrayed in lows and columns, e) to write data into a desired memory, applying a programming voltage to the gate line connecting with the desired memory and applying a voltage to the drains of the undesired memories in order not to write data into the undesired memories, and f) to read data from a desired memory, determining whether or not a current flows through a drain line connecting to the drain of the desired memory when a sense voltage is applied to a gate line connecting with the memory gate electrode of the desired memory as well as applying a reading voltage to the source line.

The above, and other objects, features and advantages of the present invention will become apparent from the following description read in conjunction with the accompanying drawings, in which like reference numerals designate the same elements.

DETAILED DESCRIPTION OF THE INVENTION

An embodiment according to the present invention will be described with reference to the figures.

Figure 1:
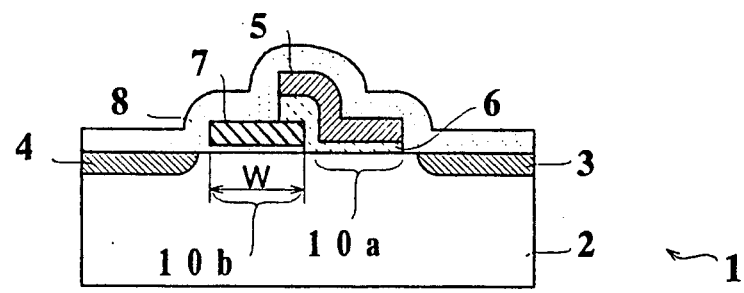
FIG. 1 is a sectional view showing schematically a nonvolatile memory 1 according to related art.
Figure 1:
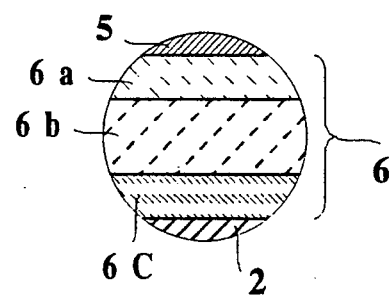
Figures 2A, 2B:
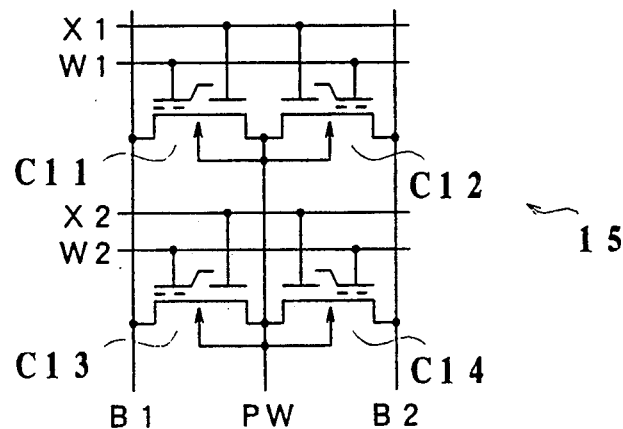
FIG. 2A is a conceptual view showing a memory circuit constructed by using the nonvolatile memory 1 and FIG. 2B is a table showing an example of combinations of voltages applied to each of the individual lines at erasing, writing and reading operation.
Figure 3:
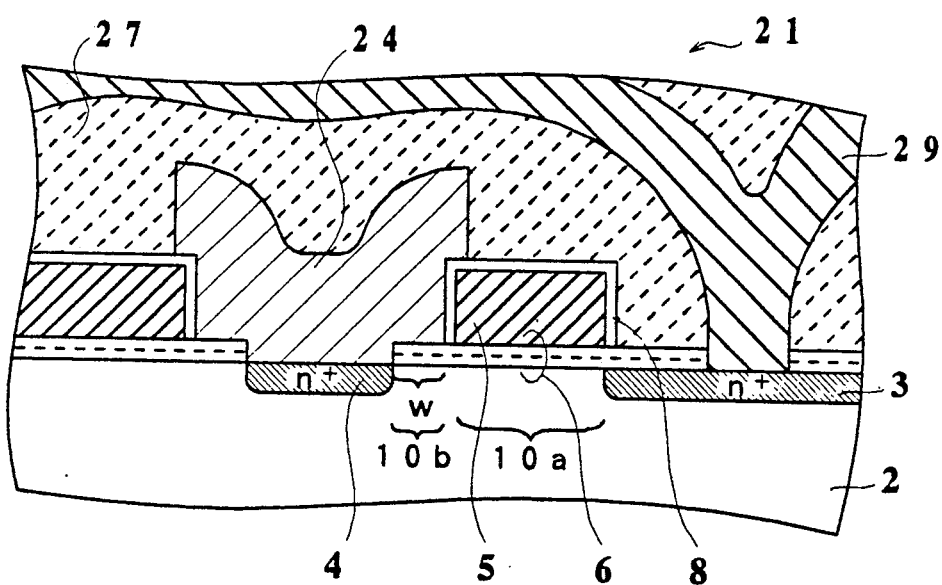
FIG. 3 is a sectional view showing schematically a nonvolatile memory according to one embodiment of the present invention.

FIG. 3 shows a nonvolatile memory 21 according to the embodiment of the present invention. Referring to FIG. 3, the nonvolatile memory 21 comprises a substrate of semiconductor in which a P type well 2 is formed, for the surface of the well 2 a source 4 of a first region and a drain 3 of a second region being provided. Both the source 4 and the drain 3 are a diffusion layers of N+ type conductivity. A surface of a space between the source 4 and the drain 3 comprises a first portion 10a and a second portion 10b, the conductivity of which can be controlled by application of an electric field.

An insulating layer 6 for holding electrons spans the surface of the space comprising the first portion 10a and the second portion 10b, and are comprised of three layer: a silicon dioxide layer 6a, a silicon nitride layer 6b, a silicon dioxide layer 6c, the same as the memory explained in Description of the Prior Art. The silicon nitride layer 6b is where electrons can be trapped by applying a bias between the well 2 and a memory gate electrode 5 of a control electrode which is on the insulating layer 6 and spans the first portion 10a.

The entire surface of the memory gate electrode is covered with an insulating layer 8. A first region electrode 24 attached to the source 4 covers the surface of the second portion 10b and a part of the surface of the memory gate electrode 5. But the first region electrode 24 is insulated from the memory gate electrode 5 by the insulating layer 8. A layer 27 is an insulator on which is a drain line 29 of aluminum connecting to all drains arrayed in a row (not shown).

Figures 6A, 6B:
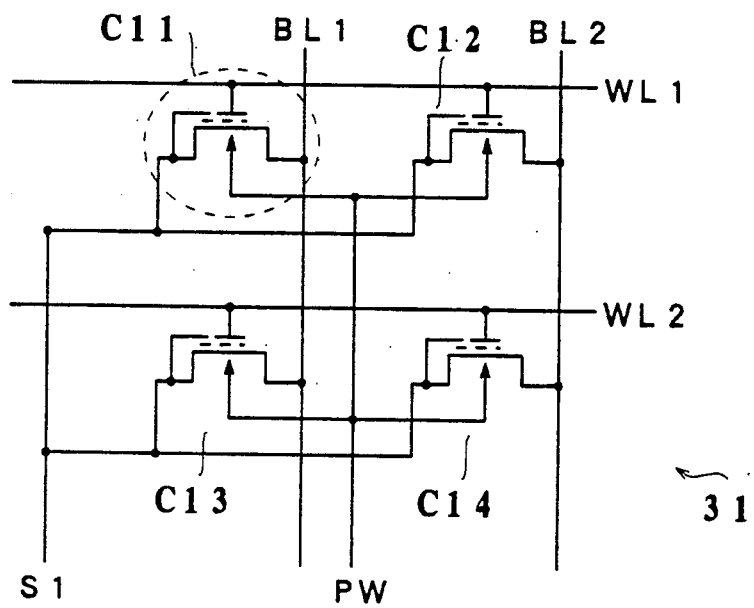
FIG. 6A is a conceptual view showing a memory circuit constructed by using the nonvolatile memory 21 and FIG. 6B is a table showing an example of combinations of voltages applied to each of the individual lines during erasing, writing and reading operation.

A memory circuit 31 can be composed of the above-mentioned memories which array in rows and columns. The memory circuit 31 is shown in partial view of equivalent circuit in FIG. 6A. As shown in FIG. 6A, each of word lines WL of gate lines connects with all the memory gate electrodes 5 of memories arrayed in a row, each of a plurality of bit lines of drain lines connects with all the drain of memories arrayed in a column, a source line S1 connects with all the source 4 of memories arrayed in rows and columns and a well line PW connects with all the well 2 of the memories arrayed in rows and columns.

So as not to write data into and read from memories other than a desired memory, the following means can select a desired memory from the memory circuit.

FIG. 6B is a table showing an example of combinations of voltages applied to each of the individual lines during erasing, writing and reading operations, the combination enabling the memory circuit to select a desired memory, for example, a memory C11 during writing and reading operation.

More specifically, to write data into the selected memory C11, a programming voltage of 10 V is applied to the word line WL1, a voltage of 7 V is applied to the bit line BL2 and a voltage of 0 V is applied to the other individual lines.

Returning to FIG. 6A and referring to the selected memory C11, the memory gate electrode 5 has a positive potential relative to all of the well 2, the source 4 and the drain 3, and thereby electrons in the well 2 are trapped in the insulating layer 6.

Note that "programming voltage" is a voltage applied to the memory gate electrode 5 relative to all of the well 2, the source 4 and the drain 3 whereby electrons in the well 2 move to the insulating layer 6 and get trapped therein.

Referring to the nonselected memory C12, the first portion 10a is conductive because the voltage of 10 V is applied to the memory gate electrode 5. Therefore, as the voltage of 7 V is applied to the drain 3 the first portion 10a has a voltage of 7 V. At that time, there is not a sufficient a potential difference between the memory gate electrode 5 and the well 2 enough to trap electrons in the insulating layer 6.

Referring to the other nonselected memory C13 and C14, both of the second portions 10b are nonconductive because a voltage of 0 V is applied to the memory gate electrode 5 relative to the well 2.

Note that the second portion 10b of memories C12 and C14 remain nonconductive because of the voltage of 0 V applied to the source line S1. Therefore, the voltage of 7 V applied to the bit line BL2 can travel into the first portion 10a of the memory C12 without a loss.

Reading operation is effected by applying a "sense voltage" of 3 V to the word line WL1, applying a "reading voltage" of 2 V to the source line S1, leaving the bit line BL2 floating connecting to a sense amplifier (not shown) and applying a voltage of 0 V to each of the other individual lines.

Note that "sense voltage" is a voltage which lies between such a minimum voltage applied to the memory gate electrode 5 relative to the well 2 such that the first portion 10a can change from nonconductive into conductive when the insulating layer 6 has electrons trapped therein, and such a minimum voltage applied to the memory gate electrode 5 relative to the well 2 such that the first portion 10a changes from nonconductive into conductive when the insulating layer 6 has no electrons trapped therein.

Therefore, when electrons are trapped in the insulating layer 6 and the sense voltage is applied to the memory gate electrode 5, the first portion 10a changes from nonconductive into conductive. Meanwhile, when electrons are not trapped in the insulating layer 6 and the sense voltage is applied to the memory gate electrode 5, the first portion 10a remains nonconductive.

Note that when "reading voltage" is applied to the source 4 the second portion 10b change from nonconductive into conductive without causing electrons in the well 2 to be trapped in the insulating layer 6. Therefore, in this embodiment, a reading voltage of 2 V may be applied to the source 4.

Returning to FIG. 6A and referring to the selected memory C11, the second portion 10b is conductive because the reading voltage of 2 V is applied to the source line S1 (see FIG. 3). When the insulating layer 6 have electrons trapped therein, even when the voltage of 3 V is applied to the word line WL1 the first portion 10a remains nonconductive. Therefore, no current flows between the source 4 and the drain 3. Conversely, when the insulating layer 6 has no electrons trapped therein and the sense voltage of 3 V is applied to the word line WL1 the first portion 10a changes into conductive. Therefore, a current flows between the source 4 and the drain 3.

Referring to the nonselected memory C12, the second portion 10b is conductive because the reading voltage of 2 V is applied to the source line S1. The bit line BL2 is left floating. Therefore, no current flows between the source 4 and the drain 3 even when the first portion 10a is conductive. Referring to the nonselected memory C13 and C14, because the word line WL2 has the voltage of 0 V applied thereto and thereby the second portion 10b is nonconductive, no current flows between the source 4 and the drain 3.

At that time, the sense amplifier (not shown) connecting to the bit line BL1 can detect whether or not a current flows through the bit line BL1.

As is described above, in the memory circuit, data can be written into and read from a desired memory.

Meanwhile, erasing operation is effected by applying a voltage of 10 V to both the well line PW and the word line WL2, applying a voltage of 0 V to the word line WL1, and leaving the bit lines BL1 and BL2, and the source line S1 floating.

Referring to the selected memories C11 and C12, since the well line PW has voltage of 10 V and the memory gate electrodes 5 have a voltage of 0 V, the electric field developed between the well 2 and the memory gate electrode 5 make electrons in the insulating layer 6 move into the well 2. This indicates that the data of the memories has been erased.

Referring to the nonselected memories C13 and C14, since the wells 2 have the voltage of 10 V and the memory gate electrodes 5 have the voltage of 10 V, no electric field develops between the well 2 and the memory gate electrode 5. Therefore, the data of the memories is left unchanged.

Note that when the voltage of 10 V is applied to the word line WL2 as well as the word line WL1 all memory can be erased at the same time.

As is described above, the nonvolatile memory 21 is characterized in that the first region electrode 24 attaching to the source 4 cover the surface of the second portion 10b. Therefore, when the reading voltage is applied to the source 4 during reading operation the second portion 10b becomes conductive and thereby the sense amplifier connected to the bit line BL1 can detect whether or not current flows through the bit line BL1.

As a result of this, compared with the memory circuit constructed using by two-transistor cell, the abovementioned memory circuit has advantages in integrating the memory circuit as well as memory cell thereof, and in cutting down the manufacturing expense.

The manufacturing process for a memory circuit constructed using by the memory cells 21 will be described below.

Figure 4A:
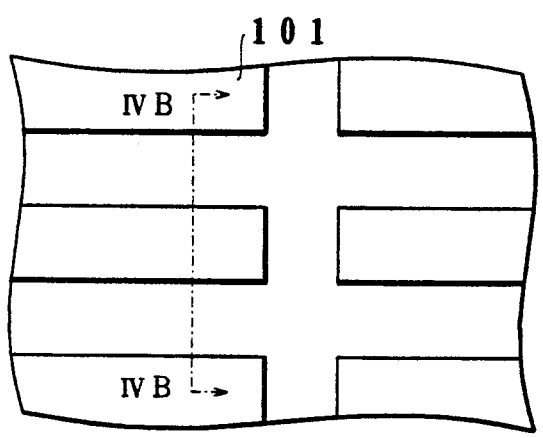
FIGS. 4A through 4E are views showing the manufacturing process of the memory circuit.
Figure 4B:
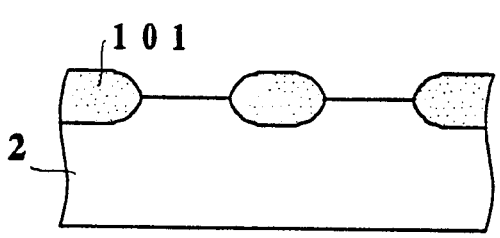

Field oxide layers 101 are formed in a well 2 which are provided for a substrate of semiconductor as shown in FIG. 4A by Local Oxidation of Silicon (LOCOS) technique to divide the substrate into the plural insulated islands. Note that FIG. 4B is a IVB—IVB sectional view to FIG. 4A. In the embodiment, the depth of the field oxide layer 101 is 600 nm.

Figure 4C:
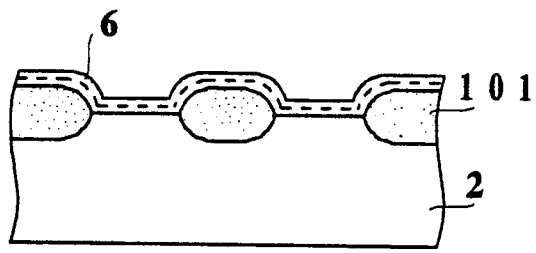

After cleaning the substrate, a silicon dioxide layer 2 nm in thickness is formed on the substrate by partial oxidation technique. A silicon nitride layer 15 nm in thickness is deposited on top of the silicon dioxide layer by Low pressure CVD (chemical vapor deposition) technique. A silicon dioxide layer 5 nm in thickness is formed on the silicon nitride by wet oxidation technique. An insulating layer 6 for holding electrons is comprised of the three layer applied in this way as shown in FIG. 4C.

Figure 4D:
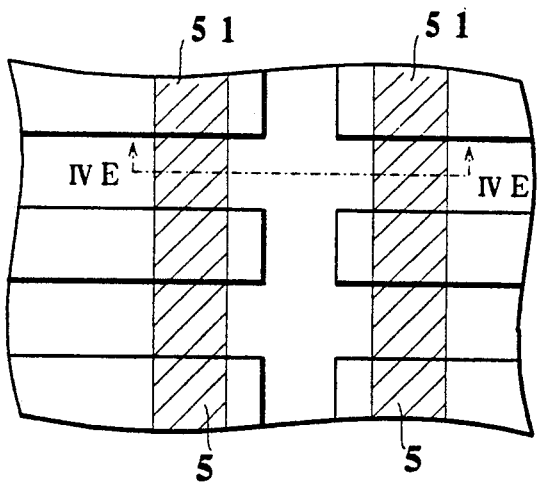
Figure 4E:
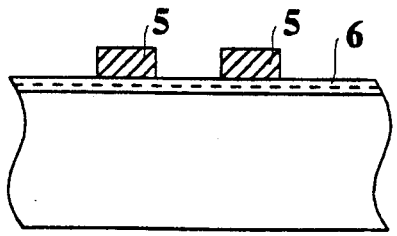

Thereafter, as shown in FIG. 4D, layers of polycide is deposited on top of the insulating layer 6 and form a memory gate electrode 5. FIG. 4E is a VIE—VIE sectional view to FIG. 4D.

Figure 5A:
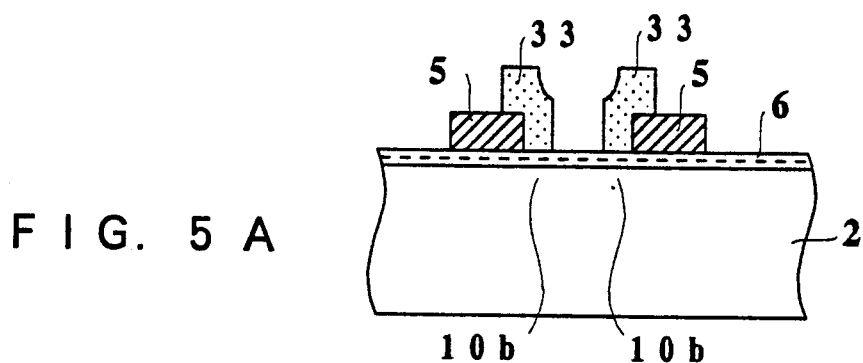
FIGS. 5A through 5D are views showing the manufacturing process of the memory circuit.
Figure 5B:
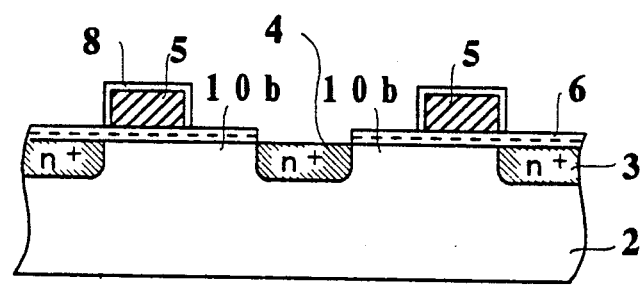

Referring to FIG. 5A, after covering a part of the surface of the insulating layer 6 adjacent to the memory gate electrodes 5 with a resist pattern, ion-implant and thermal diffusion step is subjected to the substrate and thereby forming an n+ drain 3 and an n+ source 4 in the surface of the substrate, the drain 3 and the source 4 defining the first portion 10a and the second portion 10b (see FIG. 5B).

Figure 5C:
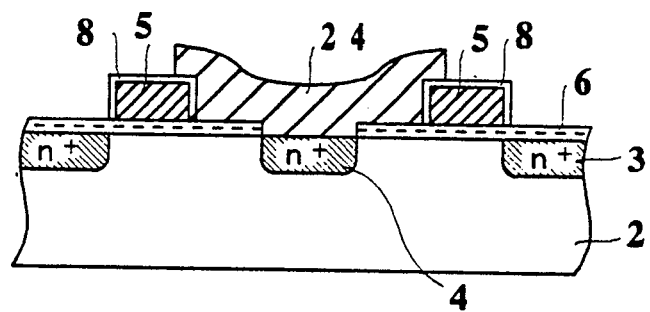

Referring to FIG. 5C, after the surface of the memory gate electrode 5 is subjected to oxidation an opening for a first region electrode is created in the insulating layer 6. Then a layer of polycide is deposited on the entire surface of the substrate and form the first region electrode is formed by etching using a photoresist pattern as a mask.

Figure 5D:
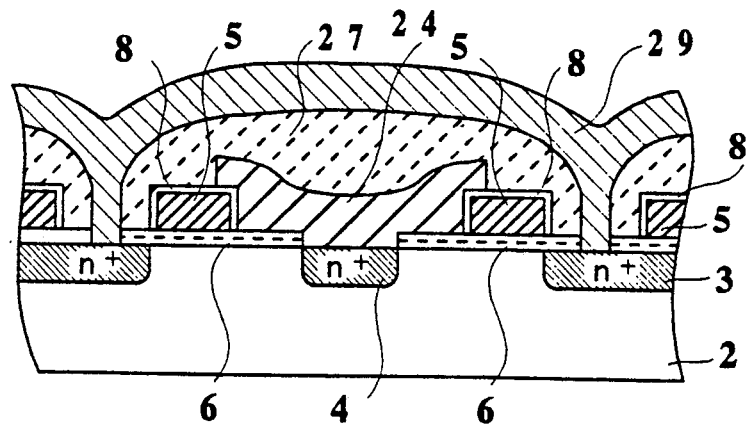

Referring to FIG. 5D, a layer 27 of silicon dioxide is provided for the top of the resulting substrate. After an opening for electrode to be attached to the drain 3 is created in the layer 27 and a layer of Aluminum silicon is deposited on top of the resulting substrate, the layer form bit lines 29 which are drain lines by etching using a photoresist pattern as a mask (see FIG. 3).

At last, a layer (not shown) of passivation is subjected to the resulting substrate.

Although in the preferred embodiment the insulating layer 6 of the memory consists of the silicon dioxide layer 6a, the silicon nitride layer 6b and the silicon dioxide layer 6c, in alternative embodiments an insulating layer may consist of a silicon dioxide layer and a silicon nitride layer and also may comprise any one of layers provided that the layer is capable of holding electrons at writing operation.

Although in the preferred embodiment the source 4 and the drain 3 are semiconductors of N+ type and the first portion 10a and the second portion 10b are semiconductors of P type, in alternative embodiments the two regions may also be semiconductors of P type and the two portions may be semiconductor of N+ type.

Although in the preferred embodiment the insulating layer 6 for holding electrons spans the first portion and the second portion, in alternative embodiments an insulating layer for holding electrons may be used to span the first portion and an insulating layer such as a silicon oxide layer may be used to span the second portion. In the alternative embodiments, a reading voltage whose power is larger than the reading voltage of 2 V can be used to read data from a desired memory and thereby improve in the speed of reading operation.

Figure 12A:
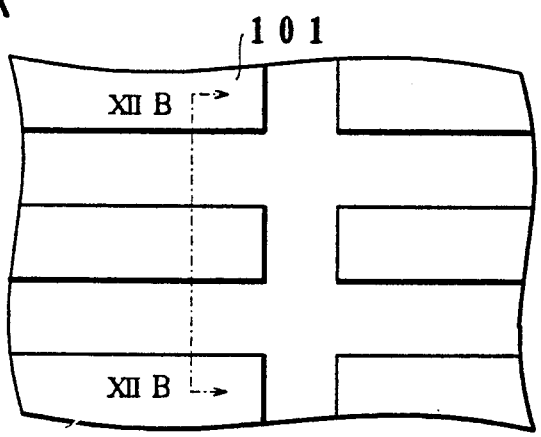
FIGS. 12A through 12F are views showing the manufacturing process of the memory circuit constructed by using the nonvolatile memory of the alternative embodiment of the present invention.
Figure 12B:
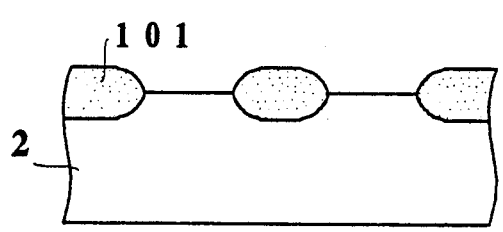
Figure 12C:
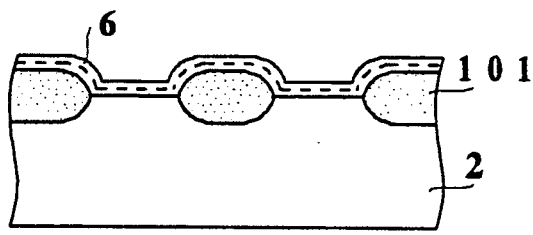
Figure 12D:
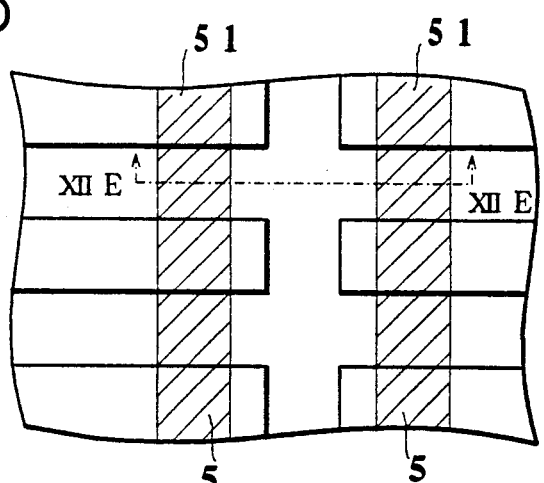
Figure 12E:
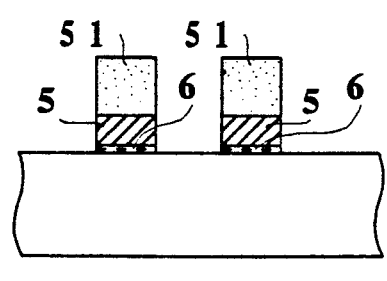
Figure 12F:
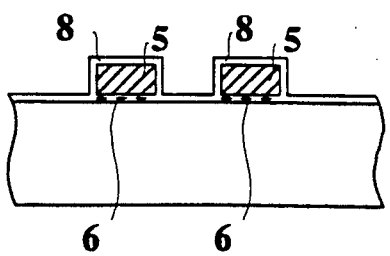

Principal manufacturing processes for the memory of this alternative embodiment will be described with reference to FIGS. 12A through 12E. After a field oxide layer 101 is formed on the substrate 2 (see FIGS. 12A and 12B) and an insulating layer for holding electrons is formed on the surface of the resulting substrate (see FIG. 12C), a layer of polysilicon is deposited on the entire surface of the resulting substrate as shown in FIG. 4C. After a resist pattern 51 covers the entire surface of the areas on what are to be a memory gate electrode 5 (see FIG. 12D) the layer of polysilicon is etched using the resist pattern 51 as a mask to form the memory gate electrode 5 on the substrate. The resulting substrate is then subjected to a etching step wherein the resist pattern 51 is used as a mask to remove the unwanted insulating layer 6 for holding electrons as shown in FIGS. 12D and 12E. After the resist pattern 51 is removed the resulting substrate is subjected to a wet oxidation technique step to form an insulating layer of a silicon oxide layer 40 nm in thickness on the exposed surface of the substrate 2 and an insultaing layer 8 on the memory gate electrode 5 as shown in FIG. 12F.

The memory circuit and manufacturing method therefor according to the above-described embodiment is characterized in that the space which the source 4 and the drain 3 define comprises the first portion 10a and the second portion 10b, that the memory gate electrode 5 spans the first portion 10a and that the first region electrode 24 attaching to the source 4 spans the second portion 10b with being electrically disconnected from the memory gate electrode 5.

Therefore, by applying the reading voltage to the first region electrode 24, it can be effected to turn on the second portion connecting the first portion 10a and the source 4. As a result of this, the memory circuit may be constructed by using one-transistor cells and to be integrated.

The method for operating the memory circuit according to the above-described embodiment comprises steps of arraying the memories in rows and columns, connecting each of drain lines to all the drains of the memories arrayed in a row, connecting each of gate lines to all the memory gate electrodes of the memories arrayed in a column, connecting a source line to the sources of all the memories arrayed in rows and columns, to write data into a desired memory, applying a programming voltage to the gate line connected with the desired memory and applying a voltage to the drains of the undesired memories in order not to write data into the undesired memories, and, to read data from a desired memory, determining whether or not a current flows through a drain line connecting to the drain of the desired memory when a sense voltage is applied to a gate line connected with the memory gate electrode of the desired memory as well as applying a reading voltage to the source line.

Therefore, it is possible to provide a nonvolatile semiconductor memory circuit that comprises one-transistor cells and yet is able to write data into and read data from a desired memory cell without mistake. As a result of this, compared with the memory circuit constructed using by two-transistor cell, the above-mentioned memory circuit have advantages in integrating the memory circuit as well as its memory cell, and in cutting down the manufacturing expense.

Another embodiment according to the present invention will be described with reference to the figures.

Figure 7:
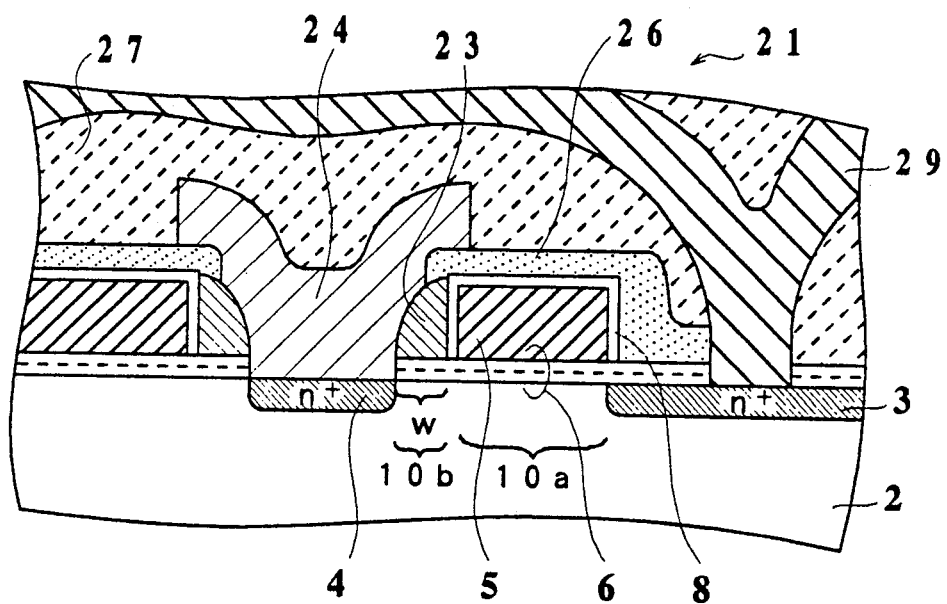
FIG. 7 is a sectional view showing schematically a nonvolatile memory 21 according to another embodiment of the present invention.

FIG. 7 shows a nonvolatile memory 61 according to another embodiment of the present invention. Referring to FIG. 7, the nonvolatile memory 61 comprises a substrate of semiconductor in which a P type well 2 is formed, a source 4 of a first region and a drain 3 of a second region being provided for the surface of the well 2. Both the source 4 and the drain 3 is diffusion layer of N+ type conductivity. A surface of a space between the source 4 and the drain 3 comprises a first portion 10a and a second portion 10b, the conductivity of which can be controlled by application of electric field.

An insulating layer 6 for holding electrons spans the first portion 10a and the second portion 10b and is comprised of three layers: a silicon dioxide layer 6a, a silicon nitride layer 6b, a silicon dioxide layer 6c, as the memory explained in Description of the Prior Art. The silicon nitride layer 6c is where electrons can be trapped by applying a bias between the well 2 and a memory gate electrode 5 of a control electrode which is on the insulating layer 6 and spans the first portion 10a. A conductive body 23 is on top of the insulating layer 6 and insulated from the memory gate electrode 5 by an insulating layer 8, spanning the second portion 10b.

The insulating layer 8 is covered with an insulating layer 26. But the first region electrode 24 attached to the source 4 connects with the conductive body 23. Surfaces of both the insulating layer 26 and the first region electrode 24 are covered with an insulating layer 27. On the layer 27 is a drain line of aluminum connecting to all sources arrayed in rows and columns (not shown).

A memory circuit can be constructed by using the above-mentioned memories 61 arrayed in rows and columns. Method for operating this memory circuit is the same as that for operating the above-described memory circuit constructed by using the memories 31.

Note that in the nonvolatile memory 61 the conductive body 23 connects with the first region electrode 24. Therefore, the reading voltage applied to the first region electrode 24 changes the second portion 10b into conductive. At that time which data is stored in the memory can be determined by using the reading voltage applied to the first region electrode 24.

The manufacturing process for a memory circuit constructed using the memory cells 61 will be described below.

Figure 8A:
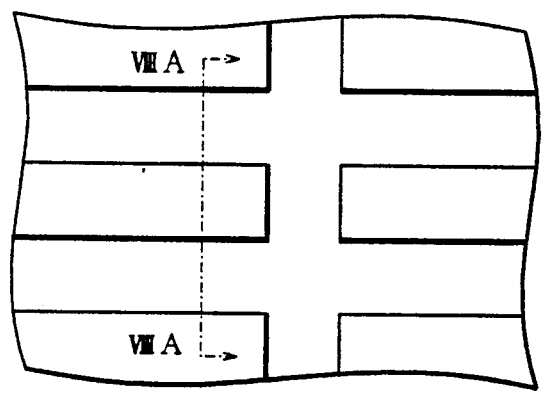
FIGS. 8A through 8E are views showing the manufacturing process of the memory circuit.
Figure 8B:
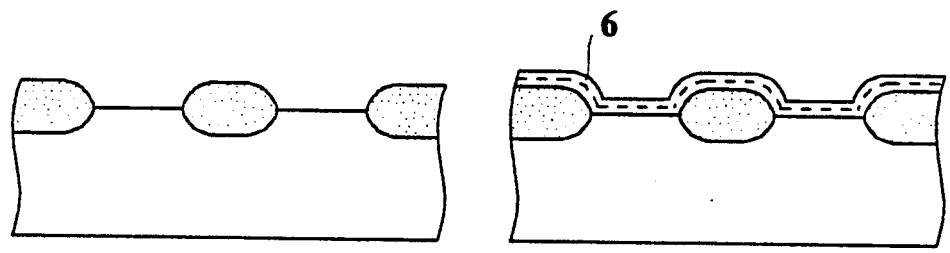

Field oxide layers 101 are formed in a well 2 which are provided for a substrate of semiconductor as shown in FIG. 8A by Local Oxidation of Silicon (LOCOS) technique to divide the substrate into the plural insulated islands. Note that FIG. 8B is a VIIIB—VIIIB sectional view to FIG. 8A. In the embodiment, the depth of the field oxide layer 101 is 600 nm.

Figure 8C:
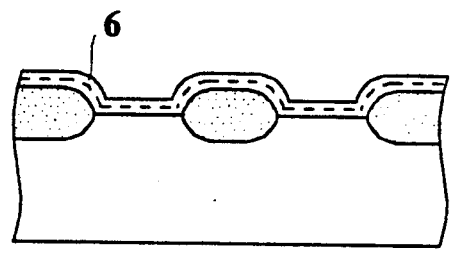

After cleaning the substrate, a silicon dioxide layer 2 nm in thickness is formed on the substrate by partial oxidation technique. A silicon nitride layer 15 nm in thickness is deposited on top of the silicon dioxide layer by Low pressure CVD (chemical vapor deposition) technique. A silicon dioxide layer 5 nm in thickness is formed on the silicon nitride by wet oxidation technique. A insulating layer for holding electrons is comprised of the three layer applied in this way as shown in FIG. 8C.

Figure 8D:
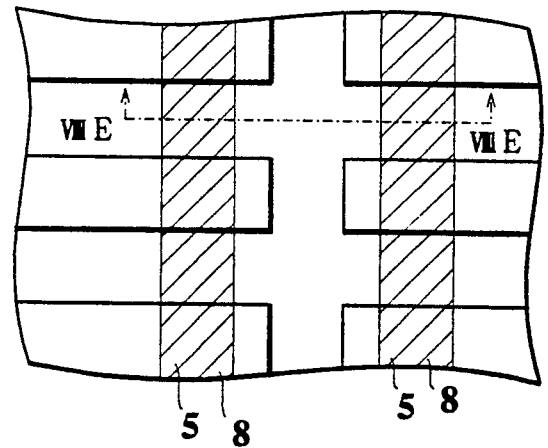
Figure 8E:
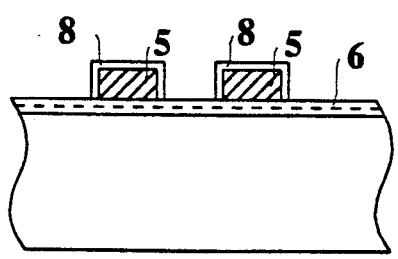

Thereafter, as shown in FIG. 8D, layers of polycide is deposited on top of the insulating layer 6 and form a memory gate electrode 5. FIG. 8E is a VIIIE—VIIIE sectional view to FIG. 8D.

Figure 9A:
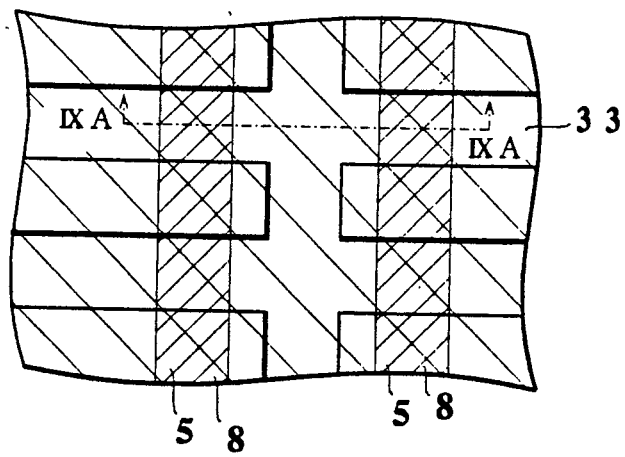
FIGS. 9A through 9D are views showing the manufacturing process of the memory circuit.
Figure 9B:
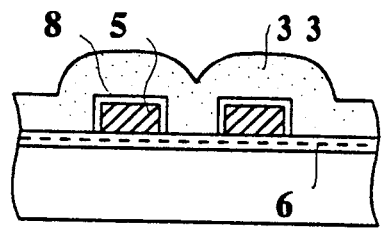
Figure 9C:
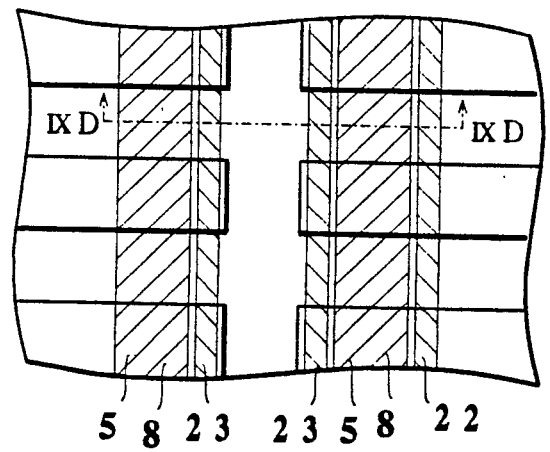
Figure 9D:
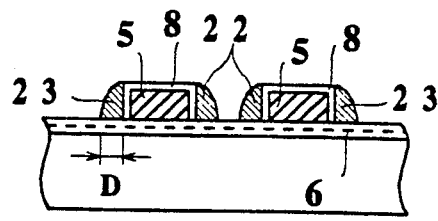

Next, on top of the resulting substrate, a layer 33 of polysilicon is deposited as shown in FIGS. 9A and 9B. FIG. 9B is a IXB—IXB sectional view to FIG. 9A. Thereafter, the resulting substrate is subjected to anisotropic etching technique such as reactive ion etching (RIE) whereby conductive bodies 22 and 23 of polysilicon are formed on both sides of the memory gate electrode 5 and remain on the insulating layer 6 as shown in FIGS. 9C and 9D. FIG. 9D is a IXD—IXD sectional view to FIG. 9C Note that isotropic etching is a technique of etching in both the lateral direction and the vertical direction while anisotropic etching is a technique of etching in only the vertical direction.

Reactive ion etching may continue until the surface of the insulating layer 6 is exposed. But reactive ion etching may further continue until the portion of the insulating layer is removed. This is because reactive ion etching is a technique of etching in only the vertical direction and has little influence on the width of the conductive body. In other words, the width D of the conductive body can be controlled easily. Therefore, the width of the region 10b can be controlled easily.

Specifically, the width D of the conductive body is determined by thickness of the layer 33. Furthermore, the thickness of the layer 33 can be controlled accurately.

Figure 10:
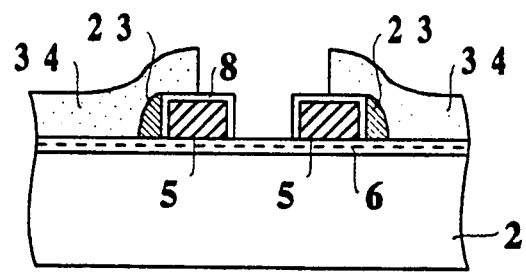
FIGS. 10A through 10E are views showing the manufacturing process of the memory circuit.
Figure 10:
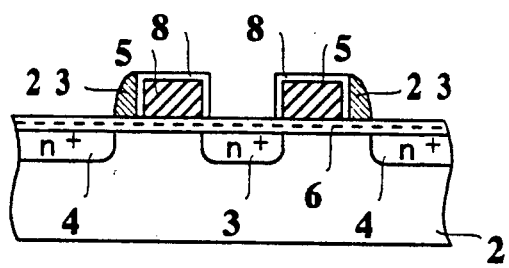
Figure 10:
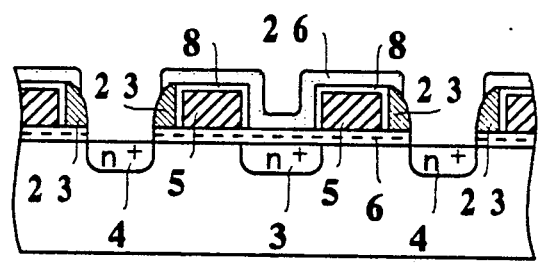
Figure 10:
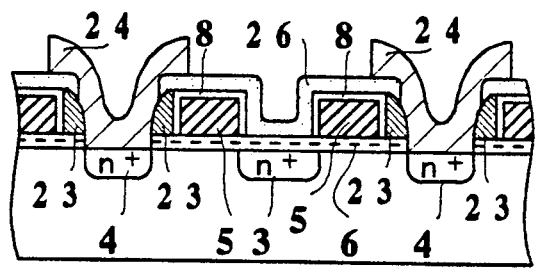
Figure 10:
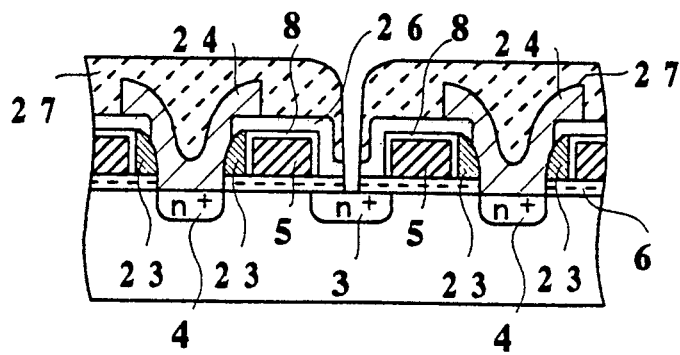
Figure 11:
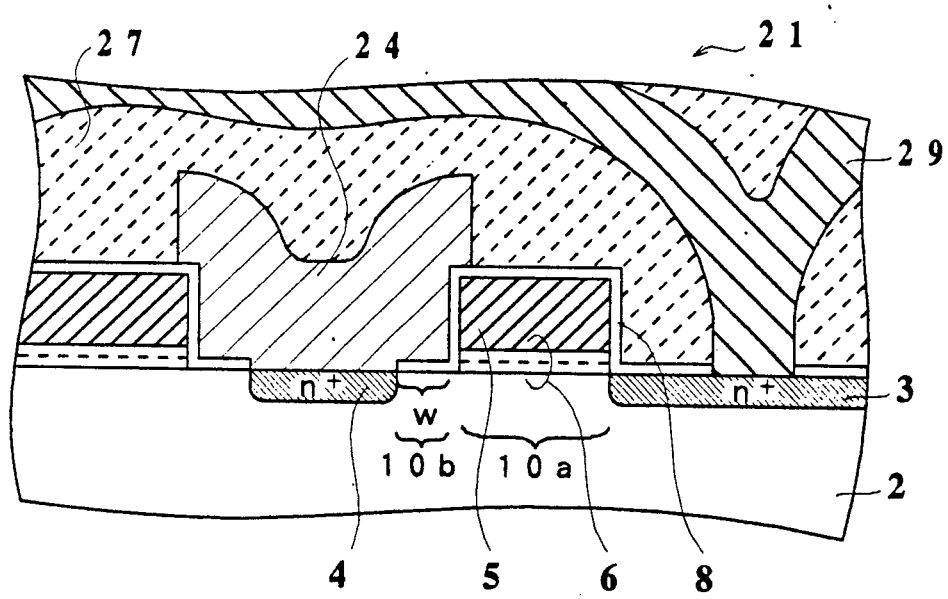
FIG. 11 is a sectional view showing schematically a nonvolatile memory according to the alternative embodiment of the present invention.

Referring to FIG. 10A, after the conductive bodies 23 on one side of the memory gate electrode 5 are then covered with a mask of photoresist the conductive bodies 22 on the other side of the memory gate electrode 5 are removed by etching technique. Referring to FIG. 10B, after the mask of photoresist is removed the substrate is subjected to ion implantation step whereby sources 4 and drains 3 of N+ type diffusion layers are formed in the well 2.

Referring to FIG. 10C, after an insulating layer 26 of silicon dioxide is deposited on the entire surface of the resulting substrate by CVD technique an opening for a first region electrode 24 is created in the insulating layer 6. Referring to FIG. 10D, a layer of polycide is then deposited on the entire surface of the substrate and form the first region electrode 24 by etching of a photoresist pattern as a mask.

Referring to FIG. 10E, a layer 27 of silicon dioxide is provided for the top of the resulting substrate. After the opening for electrode to be attached to drain is creating in the layer 27 and a layer of Aluminum silicon is deposited on top of the resulting substrate, the layer form bit lines 29 which are drain lines by etching using a photoresist pattern as a mask (see FIG. 7).

At last, a layer (not shown) of passivation is subjected to the resulting substrate.

Although in preferred embodiment the conductive body 23 connects with the source electrode 24, in alternative embodiments an insulating layer may insulate the first region electrode from the conductive body for which a control electrode is provided.

The memory of the alternative embodiment may be manufactured as follows. In the above-mentioned manufacturing method, before the insulating layer 26 of silicon dioxide is deposited by CVD technique an insulating layer of silicon dioxide is deposited on the entire surface of the resulting substrate, an opening is created in the insulating layer to expose the surface of the conductive bodies 23. A layer of polycide is then deposited on the entire surface of the substrate and form the control electrode for the conductive bodies 23 by etching of a photoresist pattern as a mask.

The memory circuit according to another embodiment comprises a substrate of semiconductor, a first region formed in the surface of the substrate, a second region formed in the surface of the substrate and defining a space between the first region and the second region, the surface of the space comprising a first portion and a second portion, an insulating layer for holding electrons spanning the first portion and the second portion, a control electrode being on the insulating layer and spanning the first portion, and an conductive body which spans the second portion and is electrically disconnected from the control electrode.

Accordingly, compared with the memory circuit constructed using by two-transistor cell, the above-mentioned memory circuit have advantages in integrating the memory circuit, and in controlling the width of the second portion. These advantage permit the cell of the memory circuit to integrate, the memory circuit to be easy to manufacture, the manufacturing expense to be cut down and the predetermined width of the second portion 10b to be manufacture correctly.

The memory circuit is characterized in that the first region electrode attaches to the first region and connects to the conductive body.

Therefore, it is effected by applying a voltage to the first region electrode to control the conductivity of the second portion 10a. As the result of this, compared with the memory circuit constructed using by two-transistor cell, the above-mentioned memory circuit have advantages in integrating the memory circuit as well as its memory cell, in productivity thereof and in cutting down the manufacturing expense.

The method for operating the memory circuit comprises steps of arraying the memories in rows and columns, connecting each of drain lines to all the drains of the memories arrayed in a row, connecting each of gate lines to all the memory gate electrodes of the memories arrayed in a column, connecting a source line to the sources of all the memories arrayed in lows and columns, applying a programming voltage to the gate line connecting with the desired memory and applying a voltage to the drains of the undesired memories in order not to write data into the undesired memories to write data into a desired memory, and, to read data from a desired memory, determining whether or not a current flows through a drain line connecting to the drain of the desired memory when a sense voltage is applied to a gate line connecting with the memory gate electrode of the desired memory as well as applying a reading voltage to the source line.

Therefore, it is possible to provide nonvolatile semiconductor memory circuit that comprises one-transistor cells and yet is able to write data into and read data from a desired memory cell without mistake. As a result of this, compared with the memory circuit constructed using by two-transistor cell, the above-mentioned memory circuit have advantages in integrating the memory circuit as well as its memory cell, in productivity thereof and in cutting down the manufacturing expense.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device including nonvolatile memories comprising:
   a) a substrate of semiconductor,
   b) a first region formed in the surface of the substrate,
   c) a second region formed in the surface of the substrate and defining a space between the first region and the second region, the surface of the space comprising a first portion and a second portion,
   d) an insulating layer for holding electrons spanning the first portion and the second portion,
   e) a control electrode being on the insulating layer and spanning the first portion, and
   f) a first region electrode attaching to the first region, spanning the second portion and being electrically disconnected from the control electrode.

2. A semiconductor device including nonvolatile memories according to claim 1,
   wherein the insulating layer comprises a silicon dioxide layer, a silicon nitride layer on the silicon dioxide layer and a silicon dioxide layer on the silicon nitride layer.

3. A semiconductor device including nonvolatile memories according to claim 1,
   wherein the insulating layer comprises a silicon dioxide layer and a silicon nitride layer on the silicon dioxide layer.

4. A semiconductor device including nonvolatile memories according to claim 1,
   wherein the first region and the second region are made of semiconductor of P type conductivity and the first portion and the second portion is made of semiconductor of N type conductivity.

5. A semiconductor device including nonvolatile memories according to claim 1,
   wherein the first region and the second region are made of semiconductor of N type conductivity and the first portion and the second portion is made of semiconductor of P type conductivity.

6. A semiconductor device including nonvolatile memories according to claim 1,
   wherein the first region is a source, the second region is a drain and the control electrode is a memory gate electrode.

7. A method for operating the semiconductor device including nonvolatile memories of claim 6 comprising steps of:
   a) arraying the nonvolatile memories in rows and columns,
   b) connecting each of a plurality of drain lines to all the drains of the nonvolatile memories arrayed in a row,
   c) connecting each of a plurality of gate lines to all the memory gate electrodes of the nonvolatile memories arrayed in a column,
   d) connecting a source line to the sources of all the nonvolatile memories arrayed in rows and columns,
   e) to write data into a desired nonvolatile memory, applying a programming voltage to the gate line connecting with the desired nonvolatile memory and applying a voltage to the drains of the undesired nonvolatile memories in order not to write data into the undesired memories, and
   f) to read data from a desired nonvolatile memory, determining whether or not a current flows through a drain line connecting to the drain of the desired nonvolatile memory when a sense voltage is applied to a gate line connecting with the memory gate electrode of the desired nonvolatile memory as well as applying a reading voltage to the source line.

8. A semiconductor device including nonvolatile memories comprising:
   a) a substrate of semiconductor,
   b) a first region formed in the surface of the substrate,
   c) a second region formed in the surface of the substrate and defining a space between the first region and the second region, the surface of the space comprising a first portion and a second portion,
   d) an insulating layer for holding electrons spanning the first portion and the second portion,
   e) a control electrode being on the insulating layer and spanning the first portion,
   f) a conductive body which spans the second portion and is electrically disconnected from the control electrode, and
   g) a first region electrode attaching to the first region and electrically connecting with the conductive body.

9. A semiconductor device including nonvolatile memories comprising:
   a) a substrate of semiconductor,
   b) a first region formed in the surface of the substrate,
   c) a second region formed in the surface of the substrate and defining a space between the first region and the second region, the surface of the space comprising a first portion and a second portion,
   d) an insulating layer for holding electrons spanning the first portion and the second portion, the insulating layer comprising a silicon dioxide layer, a silicon nitride layer on the silicon dioxide layer and a silicon dioxide layer on the silicon nitride layer,
   e) a control electrode being on the insulating layer and spanning the first portion, and
   f) a conductive body which spans the second portion and is electrically disconnected from the control electrode.

10. A semiconductor device including nonvolatile memories according to claim 8,
    wherein the insulating layer comprises a silicon dioxide layer and a silicon nitride layer on the silicon dioxide layer.

11. A semiconductor device including nonvolatile memories according to claim 8, wherein the first region is a source, the second region is a drain and the control electrode is a memory gate electrode.

12. A method for operating a semiconductor device including nonvolatile memories, said semiconductor device including nonvolatile memories comprising:
a substrate of semiconductor,
a first region formed in the surface of the substrate,
a second region formed in the surface of the substrate and defining a space between the first region and the second region, the surface of the space comprising a first portion and a second portion,
an insulating layer for holding electrons spanning the first portion and the second portion,
a control electrode being on the insulating layer and spanning the first portion, the control electrode having a side surface, and
a conductive body which spans the second portion adjacent to the side surface of the control electrode, the conductive body being electrically disconnected from the control electrode,
wherein the first region is a source, the second region is a drain and the control electrode is a memory gate electrode,
said method for operating comprising steps of:
a) arraying the nonvolatile memories in rows and columns,
b) connecting each of a plurality of drain lines to all the drains of the nonvolatile memories arrayed in a row,
c) connecting each of a plurality of gate lines to all the memory gate electrodes of the said nonvolatile memories arrayed in a column,
d) connecting a source line to the sources of all the nonvolatile memories arrayed in rows and columns,
e) to write data into a desired nonvolatile memory, applying a programming voltage to the gate line connecting with the desired nonvolatile memory and applying a voltage to the drains of the undesired nonvolatile memories in order not to write data into the undesired nonvolatile memories, and
f) to read data from a desired nonvolatile memory, determining whether or not a current flows through a drain line connecting to the drain of the desired nonvolatile memory when a sense voltage is applied to a gate line connecting with the memory gate electrode of the desired nonvolatile memory as well as applying a reading voltage to the source line.

13. A semiconductor device including nonvolatile memories comprising:
a) a substrate of semiconductor,
b) a first region formed in the surface of the substrate,
c) a second region formed in the surface of the substrate and defining a space between the first region and the second region, the surface of the space comprising a first portion and a second portion,
d) an insulating layer for holding electrons spanning the first portion,
e) an insulating layer on the substrate and spanning the second portion,
f) a control electrode being on the insulating layer for holding electrons and spanning the first portion, and
g) a first region electrode attaching to the first region, spanning the second portion and being electrically disconnected from the control electrode.

14. A semiconductor device including nonvolatile memories according to claim 13,
wherein the insulating layer for holding electrons comprises a silicon dioxide layer, a silicon nitride layer on the silicon dioxide layer and a silicon dioxide layer on the silicon nitride layer.

15. A semiconductor device including nonvolatile memories according to claim 13,
wherein the insulating layer for holding electrons comprises a silicon dioxide layer and a silicon nitride layer on the silicon dioxide layer.

16. A semiconductor device including nonvolatile memories according to claim 13,
wherein the first region and the second region are made of semiconductor of P type conductivity and the first portion and the second portion is made of semiconductor of N type conductivity.

17. A semiconductor device including nonvolatile memories according to claim 13,
wherein the first region and the second region are made of semiconductor of N type conductivity and the first portion and the second portion is made of semiconductor of P type conductivity.

18. A semiconductor device including nonvolatile memories according to claim 13,
wherein the first region is a source, the second region is a drain and the control electrode is a memory gate electrode.

19. A method for operating the semiconductor device including nonvolatile memories of claim 18 comprising steps of:
a) arraying the nonvolatile memories in rows and columns,
b) connecting each of a plurality of drain lines to all the drains of the nonvolatile memories arrayed in a row,
c) connecting each of a plurality of gate lines to all the memory gate electrodes of the nonvolatile memories arrayed in a column,
d) connecting a source line to the sources of all the nonvolatile memories arrayed in rows and columns,
e) to write data into a desired nonvolatile memory, applying a programming voltage to the gate line connecting with the desired nonvolatile memory and applying a voltage to the drains of the undesired nonvolatile memories in order not to write data into the undesired nonvolatile memories, and
f) to read data from a desired nonvolatile memory, determining whether or not a current flows through a drain line connecting to the drain of the desired nonvolatile memory when a sense voltage is applied to a gate line connecting with the memory gate electrode of the desired nonvolatile memory as well as applying a reading voltage to the source line.

20. A semiconductor device including nonvolatile memories comprising:
a) a substrate of semiconductor,
b) a first region formed in the surface of the substrate,
c) a second region formed in the surface of the substrate and defining a space between the first region and the second region, the surface of the space comprising a first portion and a second portion,
d) an insulating layer for holding electrons spanning the first portion and the second portion, e) a control electrode being on the insulating layer and spanning the first portion, the control electrode having a side surface, f) a conductive body which spans the second portion adjacent to the side surface of the control electrode, the conductive body being electrically disconnected from the control electrode, g) said conductive body has a height substantially the same as that of the control electrode, and h) said control electrode has a width greater than that of the conductive body.

* * * * *